United States Patent
Smith et al.

(10) Patent No.: US 6,959,258 B2
(45) Date of Patent: Oct. 25, 2005

(54) METHODS AND STRUCTURE FOR IC TEMPERATURE SELF-MONITORING

(75) Inventors: Fred Smith, Colorado Springs, CO (US); Gabriel Romero, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/368,520

(22) Filed: Feb. 18, 2003

(65) Prior Publication Data

US 2004/0162697 A1 Aug. 19, 2004

(51) Int. Cl.$^7$ .............................................. G06F 15/00
(52) U.S. Cl. ...................... 702/132; 702/130; 702/136
(58) Field of Search ............................... 363/56.09, 57; 361/18, 103; 702/130, 132, 136; 324/760, 761; 374/172, 173, 178

(56) References Cited

U.S. PATENT DOCUMENTS

| | | | | |
|---|---|---|---|---|
| 4,924,212 A | * | 5/1990 | Fruhauf et al. | 340/598 |
| 5,119,015 A | * | 6/1992 | Watanabe | 323/313 |
| 5,213,416 A | * | 5/1993 | Neely et al. | 374/178 |
| 5,291,387 A | * | 3/1994 | Ohshima | 363/56.11 |
| 6,172,611 B1 | * | 1/2001 | Hussain et al. | 340/584 |
| 2003/0158697 A1 | * | 8/2003 | Gold et al. | 702/132 |

OTHER PUBLICATIONS

IC Temperature Sensors Find the Hot Spots (http://www-.dalsemi.com/appnotes.cfm/appnote_number/689) Jul. 2, 1998 issue of *EDN*; 6 pages.

* cited by examiner

*Primary Examiner*—Bryan Bui
(74) *Attorney, Agent, or Firm*—Duft, Bornsen & Fishman LLP

(57) ABSTRACT

Methods and systems are provided for thermal self-monitoring of integrated circuits. Temperature is sensed, digitized, encoded, and compared to one or more threshold values by circuits added within an integrated circuit. A signal produced by a thermal diode within an integrated circuit is applied to an analog to digital converter and may be compared to one or more threshold values to produce a digital over temperature condition signal. An appropriate cooling action may be initiated by processing of the digital signal so produced. Also provided are methods and systems to alter the range and resolution of the temperature threshold comparisons.

20 Claims, 5 Drawing Sheets

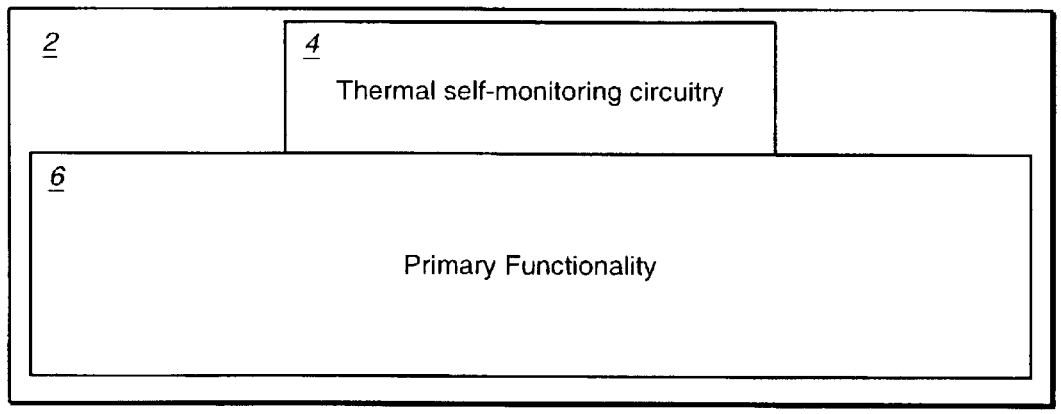
FIG._1
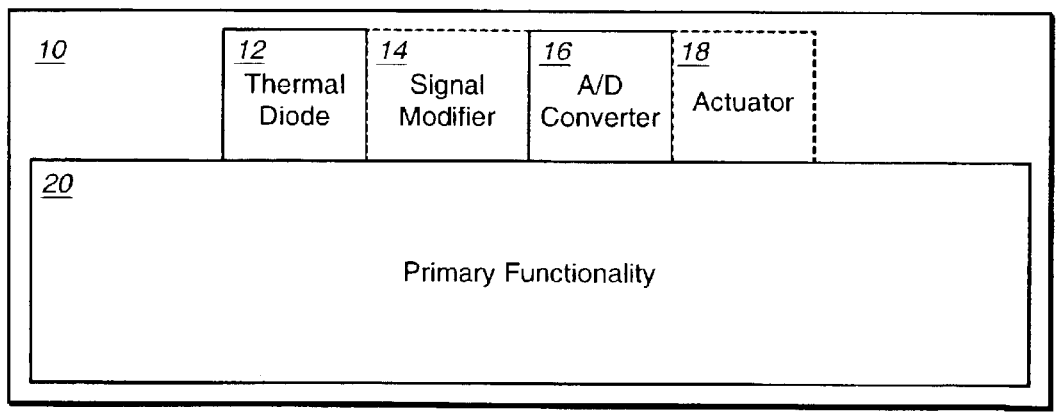
FIG._2

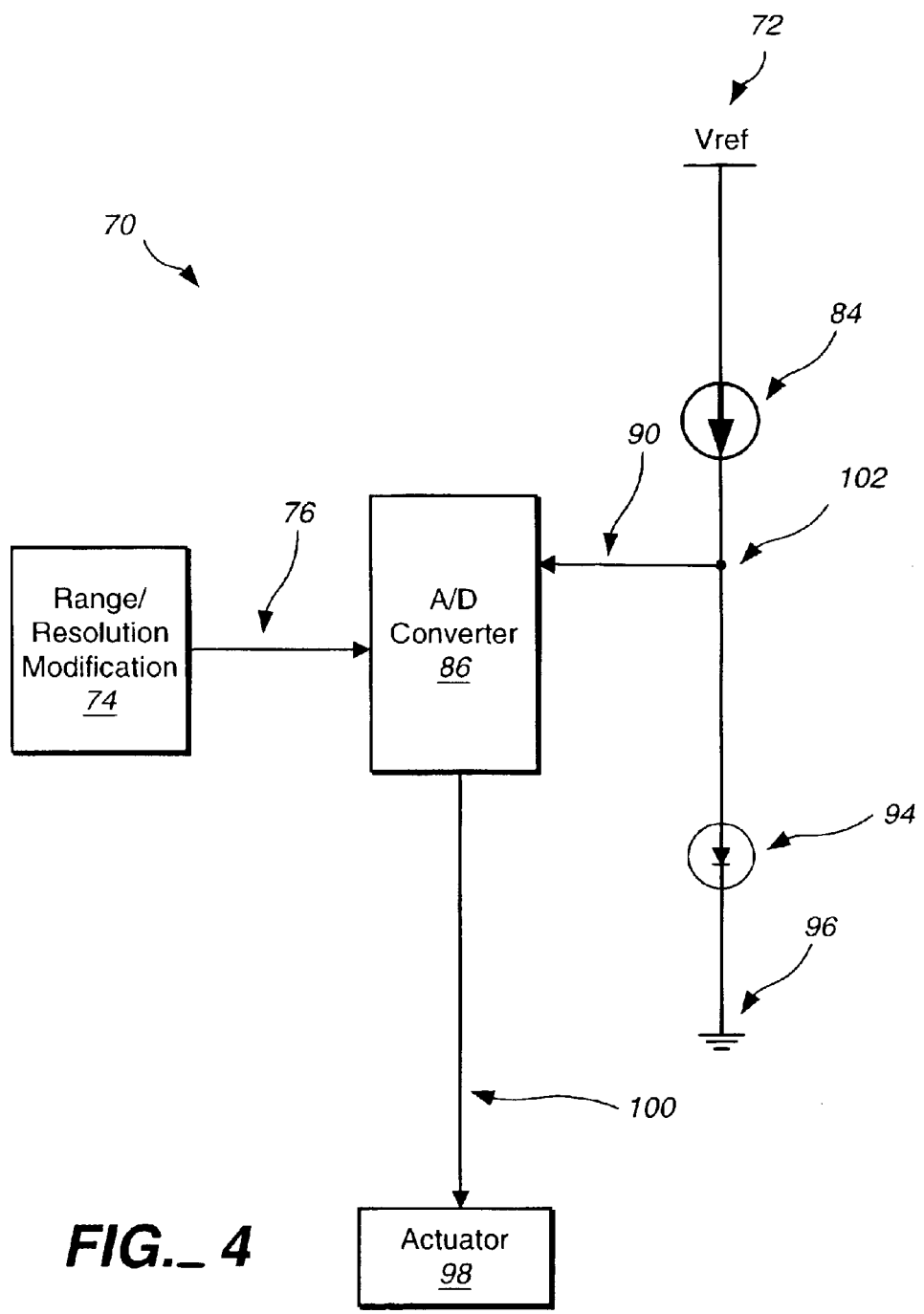
FIG._ 4

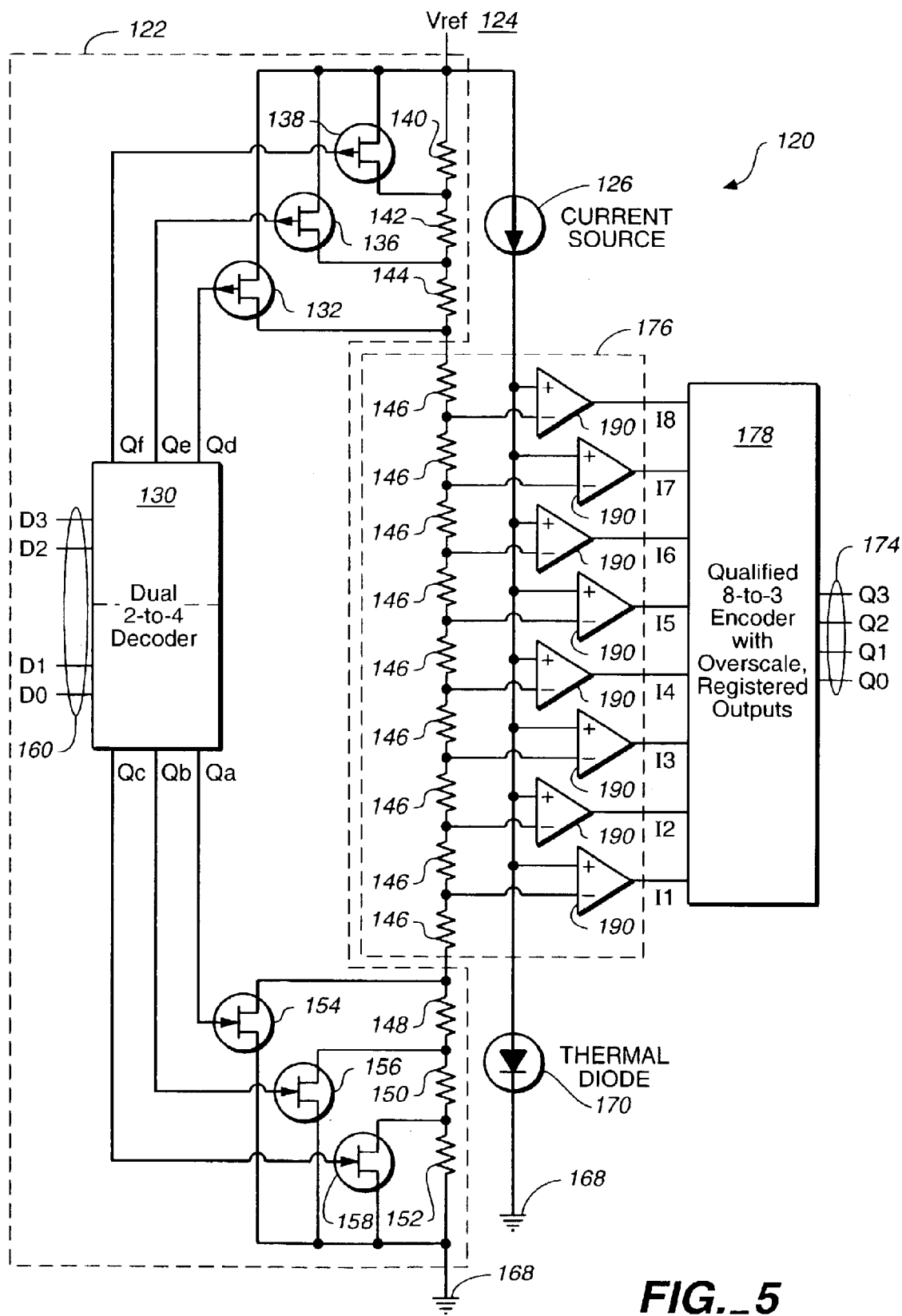
FIG._5

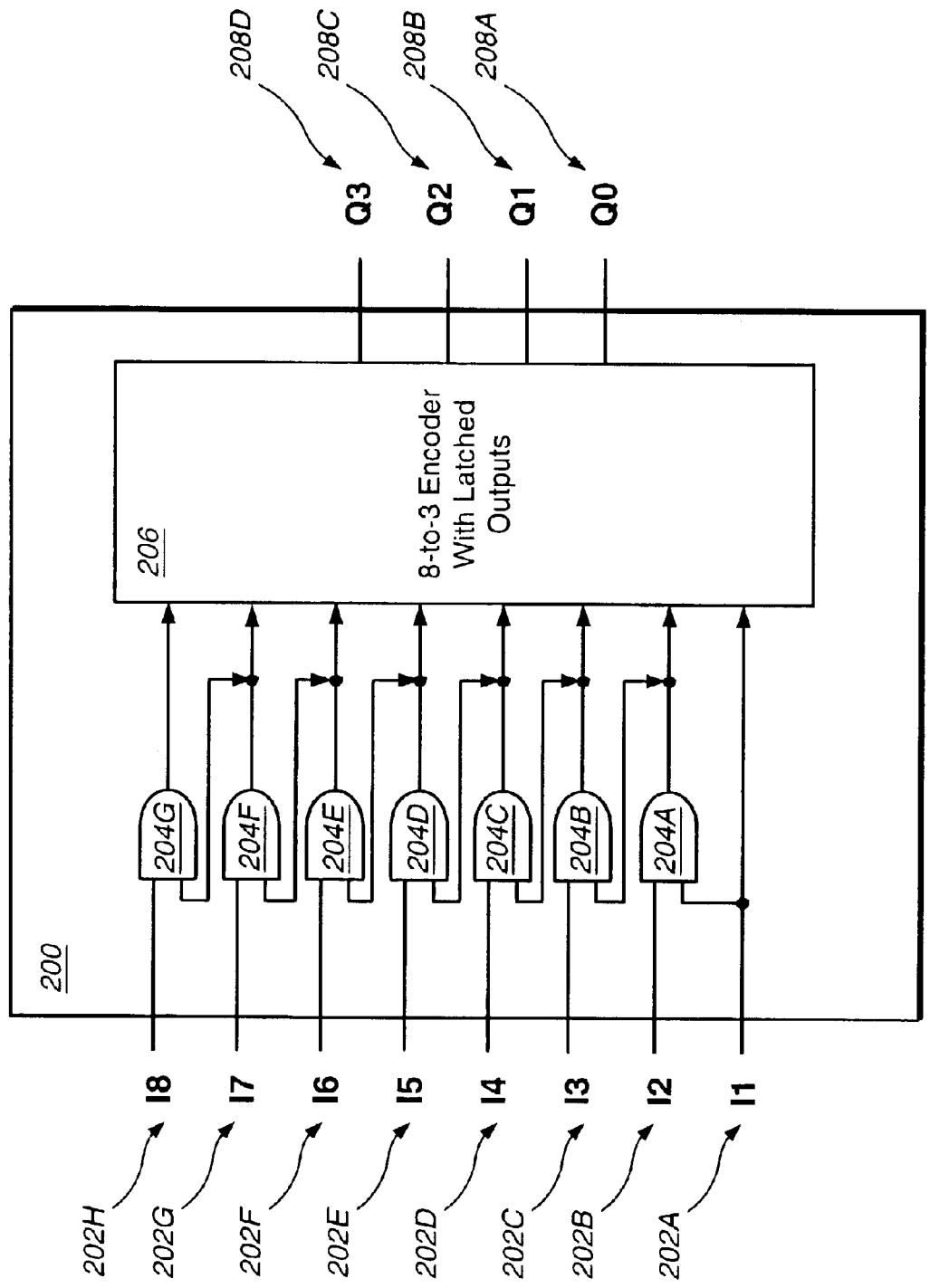
FIG._6

METHODS AND STRUCTURE FOR IC TEMPERATURE SELF-MONITORING

BACKGROUND OF THE INVENTION

1. Field of the Invention

The invention relates generally to integrated circuits and more specifically to methods and structures for temperature self-monitoring within integrated circuits.

2. Discussion of Related Art

Integrated circuits ("ICs") are electronic devices that integrate, within a single package, a significant number and variety of lower level, discrete electronic components and circuits. Common examples of such an integrated circuits are the devices within typical consumer electronic products including, for example, cellular telephones, personal digital assistants ("PDA"), personal computers, etc. By so integrating a significant number of discrete electronic components and circuits within an integrated circuit package, manufacturers can dramatically reduce costs associated with manufacturing. In addition, by more tightly coupling discrete components in a smaller space, signals exchanged between various components may do so at faster speeds and with reduced loss of signal amplitude and quality.

It is common for modem integrated circuits to integrate millions or even tens of millions of discrete electronic circuits and components within a single integrated circuit package. Enhanced functionality within a single integrated circuit package is one of the factors that contribute to the size of such an integrated circuit as measured by the number of discrete components within. It is common that the components within an integrated circuit package operate in synchronicity with one or more supplied clock signals. The frequency of the clock signals is typically one important measure of the performance of a particular integrated circuit. For example, a general-purpose microprocessor integrated circuit (CPU) may enhance its performance by increasing the frequency of the clock applied thereto.

All electronic circuits generate some amount of heat in their operation. Design and manufacturing processes may help reduce energy lost in the form of heat energy, however it remains axiomatic that operating electronic circuits will continue to generate heat. As the density of discrete components integrated within a single integrated circuit package rises, the heat generated within such a package may increase dramatically. Examples of very high density integrated circuits are the circuits presently referred to as "System On a Chip" or "SOC." A SOC contains in a single integrated circuit common in, for example, present day personal computers. For example, such a SOC may include a CPU, a memory controller and direct memory access controller ("DMAC"), a PCI bus interface component or other peripheral I/O interface buses, graphics controller, etc. Such a highly integrated circuit can dramatically reduce the manufacturing cost of present day personal computers and other consumer electronic products. However, such high component density increases problems of heat generation and dissipation.

Furthermore, in addition to circuit density as a factor in heat generation, clock frequency of the clock signals supplied to such integrated circuits is another contributing factor to generation of heat. In other words, the faster electronic circuits operate, in general, the more heat generated by operation of that circuit. Processor clock speed of present day personal computers continues to push the limits of present technology and heat generation and dissipation.

Therefore, as can be seen, enhanced functionality and increased clock speed of present-day integrated circuits gives rise to a significant problem in that operating integrated circuits must be kept within desirable operating temperature ranges to avoid damage to the integrated circuit—damage even to the extent of partial or total failure thereof.

As the complexity and corresponding heat generation of modem integrated circuits has risen, electronic designers often include temperature monitoring and cooling elements within electronic product designs. For example, personal computer users are familiar with the constant hum of fans used to exhaust excess heat from an operating personal computer. Where electronic products are intended for portable use it is problematic to constantly operate fans or other cooling devices because operation of such fans consumes valuable energy from the batteries of the portable device. It is therefore common in present day electronic product designs to include temperature monitoring features so that cooling devices such as fans can be intelligently controlled to preserve precious battery life in, for example, portable electronic products.

Temperature monitoring circuit designs add complexity and hence associated cost to electronic products. In typical systems such monitoring circuits are external to the integrated circuits and monitor internal ambient air temperature surrounding integrated circuits that are particularly sensitive to overheating. Such extra circuits may include a thermocouple, or other temperature transducing devices, as well as analog to digital conversion electronics for converting the analog signal generated from such a temperature sensor into an appropriate digital signal for further processing. The digital signal may then be processed in accordance with desired logic to produce appropriate control signals for management of cooling apparatus such as fans or other active cooling devices.

As can be seen from the above discussion, it remains an ongoing problem to reduce cost and complexity associated with temperature monitoring of complex integrated circuits to permit intelligent management of cooling devices within electronic products. In particular it remains a problem to monitor temperature to permit intelligent temperature controls in portable electronic products dependent on precious battery power.

SUMMARY OF THE INVENTION

The present invention solves the above and other problems and advances the state of the useful arts by providing apparatus and methods for IC thermal self-monitoring. Circuitry and methods are provided for IC thermal self-monitoring. The circuitry provided may be located within the physical IC structure and may be placed on the same circuitry chip as the IC or elsewhere within the IC encasement (e.g., an additional circuit die within the same IC package). The circuitry may include a thermal sensing diode ("thermal diode"), a current source providing a controlled current to the thermal diode, and an analog-to-digital converter ("A/D converter"). The A/D converter connects to the thermal diode to receive and convert the analog signal from the thermal diode into a digital representation of the temperature. Additionally, offset and resolution shifting circuitry may be connected to the A/D converter to provide dynamic adjustment to the temperature measurement range and resolution. Still further, an adjustment to the A/D digital output signal may help reduce or eliminate the effects of transient signals such as brief temperature differences or noise signals related to power fluctuations.

The thermal self-monitoring architecture of the present invention is of primary importance with complex chips but may be applied as a matter of design choice to less complex components, such as smaller-scale integrated circuits, or any electronic device that may benefit from thermal self-monitoring. An SOC is one example of a complex IC that may beneficially apply the present invention. In an SOC, many complex components of a typical present day personal computer are integrated within a single, complex integrated circuit. A benefit of IC thermal self-monitoring is the reduction or elimination of external circuitry required for thermal management. As a result, compact electronic systems may be developed increasing system performance, adding thermal mitigation options, increasing reliability, and decreasing manufacturing complexity.

A first feature of the invention provides a method for temperature self-monitoring in an integrated circuit comprising: coupling a thermal diode within the integrated circuit to a voltage source to generate a thermal potential difference; converting the thermal potential difference to a thermal digital value within the integrated circuit; and applying the thermal digital value to an output signal pad of the integrated circuit.

Another aspect of the invention provides that the step of converting comprises: applying the thermal potential difference to an input signal path of an analog to digital converter to generate the thermal digital value as an output signal of the analog to digital converter.

Another aspect of the invention provides that the analog to digital converter is a flash analog to digital converter and also provides that the step of converting further comprises: coupling a reference input signal path of the flash analog to digital converter to a reference voltage source.

Another aspect of the invention further provides that the step of coupling the reference input signal path comprises: coupling the reference input signal path to the reference voltage source through a variable resistive element.

Another aspect of the invention further provides for coupling a programmable switch to the variable resistive element to selectively control resistance of the variable resistive element; and programming the programmable switch to vary the voltage applied to the reference input signal path.

Another aspect of the invention provides for adjusting operation of the flash analog to digital converter to reduce errors in generation of the thermal digital value.

Another aspect of the invention provides that the step of adjusting comprises: gating input signals applied to each of a series of comparators within the flash analog to digital converter to enable each higher threshold comparator in response to a comparison of a next lower threshold comparator.

Another feature of the invention provides a circuit including: a constant current source coupled to a reference voltage source; a thermal diode coupled between the constant current source and ground potential to produce a thermal potential difference; and an analog to digital converter having an input signal path coupled to a node at the thermal potential difference to generate a thermal digital signal applied to an output pad of the integrated circuit.

Another aspect of the invention further provides a range adjuster coupled to the analog to digital converter to adjust the voltage range of conversion for signal applied to the analog to digital converter.

Another aspect of the invention further provides that the analog to digital converter comprises: a flash analog to digital converter having a reference voltage input signal path coupled a reference voltage source generated by the range adjuster.

Another aspect of the invention further provides that the range adjuster comprises: an offset voltage source to offset the reference voltage applied to the reference voltage input signal path.

Another aspect of the invention further provides that the analog to digital converter comprises: a flash analog to digital converter having a reference voltage input signal path coupled a reference voltage source.

Another aspect of the invention further provides that the flash analog to digital converter generates an unqualified thermal digital signal, the unqualified thermal digital signal comprising a plurality of level indicator output signals, and further provides for a qualified encoder coupled to the flash analog to digital converter to encode the unqualified thermal digital signal to generate the thermal digital signal such that transient effects are reduced.

Another aspect of the invention provides that the plurality of level indicator output signals indicate a sequence of threshold levels of the thermal potential difference and provides that the qualified encoder includes: a plurality of AND gates coupled to the flash analog to digital converter such that the level indicator output signal representing the lowest threshold level is coupled to the qualified encoder as the lowest level input signal of the qualified encoder and such that each higher threshold level input signal is coupled to an input of a corresponding AND gate of the plurality of AND gates and such that the output of the corresponding AND gate is coupled to the qualified encoder as an input and such that another input of the corresponding AND gate is coupled to the input signal of the qualified encoder corresponding to the next lower threshold level.

Another feature of the invention provides a method operable within an integrated circuit, the method comprising: monitoring the temperature within the integrated circuit using a thermal diode; and applying a thermal digital value to output signals of the integrated circuit indicative of the present temperature within the integrated circuit.

Another aspect of the invention further provides for adjusting the thermal digital value prior to applying the thermal digital value to reduce transient effects in the monitoring.

BRIEF DESCRIPTION OF THE DRAWINGS

FIG. 1 shows a block diagram for a self-monitoring IC;

FIG. 2 shows another block diagram for a self-monitoring IC;

FIG. 4 shows a block diagram for a self-monitoring system with optional signal modification;

FIG. 5 shows a detailed schematic for a self-monitoring circuit with optional offset shifting; and FIG. 6 shows an error correcting circuit.

DETAILED DESCRIPTION OF THE DRAWINGS

Figure 3:
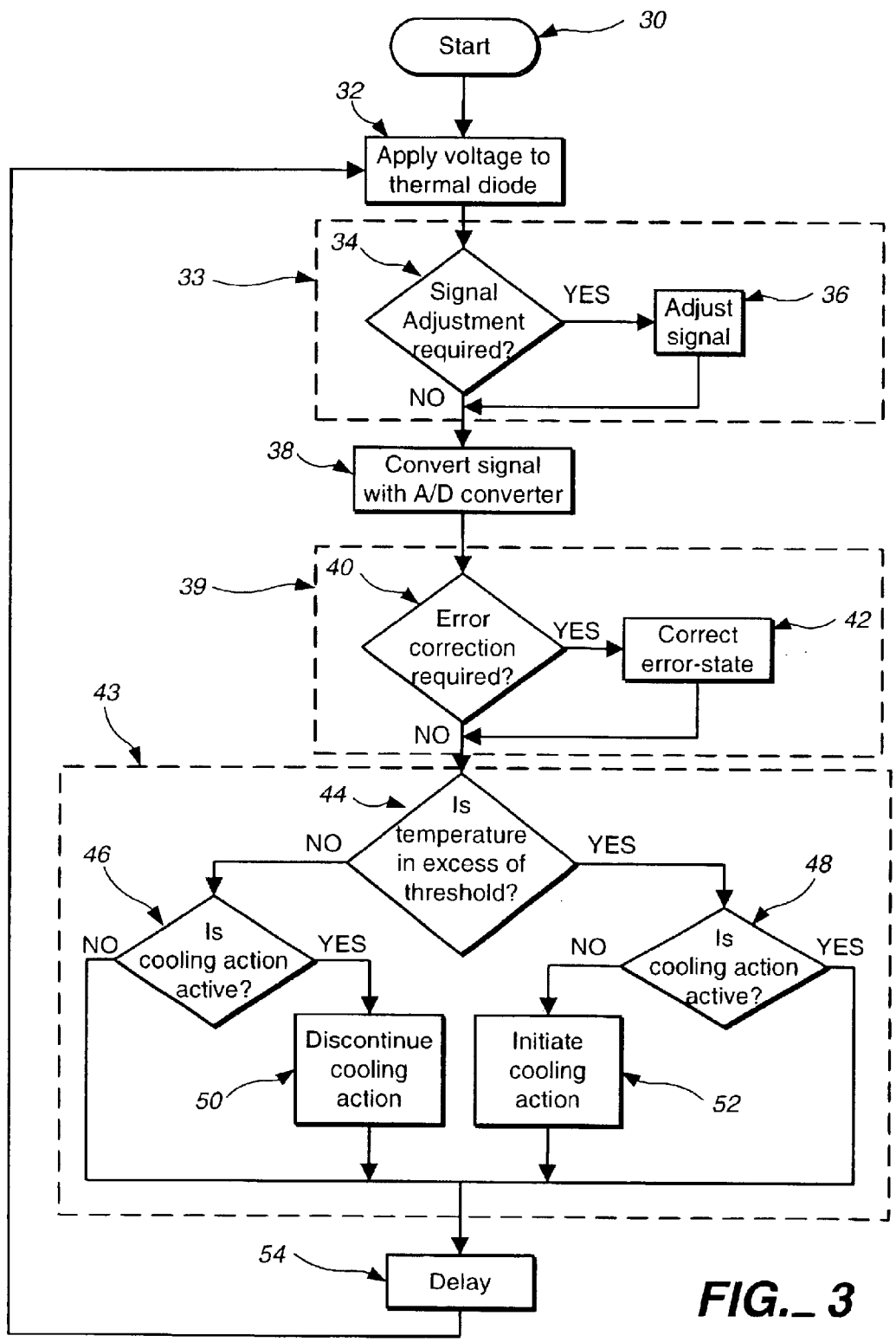
FIG. 3 shows process for self-monitoring within an IC.

While the invention is susceptible to various modifications and alternative forms, a specific embodiment thereof has been shown by way of example in the drawings and will herein be described in detail. Those skilled in the art will appreciate that the features described below can be combined in various ways to form multiple variations of the invention. As a result, the invention is not limited to the specific examples described below, but only by the claims and their equivalents.

FIG. 1 shows a block diagram for self-monitoring IC 2. Primary functionality 6 provides the core services of IC 2 for which IC 2 is intended (e.g., memory control, general processing, input/output processing, etc.). IC 2 contains thermal self-monitoring circuitry 4, shown as separate from primary functionality 6 for clarity, to provide self-monitoring functionality. Thermal self-monitoring circuitry 4 may be implemented internal to, or external from, primary functionality 6 as a matter of design choice. As noted above, primary functionality 6 of IC 2 may be any desired design including, for example, a CPU, memory controller, I/O controller, graphics controller, a SOC or other complex or simple IC designs.

FIG. 2 shows a block diagram for a self-monitoring IC 10. The core functionality of self-monitoring IC 10 is within primary functionality 20. The circuitry for thermal self-monitoring 12, 14, 16, 18, shown here as separate from primary functionality 20 for clarity, provides a circuit for temperature monitoring. Temperature is read by a sensor, such as a thermistor, or in a preferred mode as shown here, thermal diode 12, wherein an electrical measurement of flux, current, voltage, and/or resistance closely correlates to the internal temperature of IC 10. The analog temperature dependant signal, produced substantially proportionate to the magnitude of current flow through thermal diode 12, is applied to A/D converter 16 to generate a thermal digital value signal representative of the operating temperature of thermal diode 12.

Optional signal modifier 14 may further provide a range of adjustment options to provide modifications determined at the time of manufacture (e.g., pick-and-place IC circuit construction) and/or dynamically adjustable run-time alterations. Such adjustments may adapt the range and resolution of A/D converter 16 and/or modify the analog signal applied from thermal diode 12 to A/D converter 16. In general, the structure of FIG. 2 allows for adjustments to the range and resolution of the analog to digital conversion of the thermal analog signal. Such adjustments may be statically provided as part of the manufacturing process or may be dynamically performed during operation of the device. Such adjustments may account for process variations in the manufacture of the integrated circuit or variations in the threshold to be monitored among other issues.

Once a digital value of the temperature has been produced by A/D converter 16, the value of the digital value is compared to a threshold value. If the digital value is at or above a threshold value, an appropriate action may be taken. The threshold value may be determined by an "on" condition for a given output line or a numeric comparison of digital values. If a numeric processing of values is required, as a design option, the state of the current temperature (e.g., below normal, normal, above normal, well above normal, critical, etc.), and the cooling action to take (e.g., discontinue all active actions, discontinue an action, status quo, initiate action 1, initiate action 2, etc.) may be processed by distributing functionality between primary functionality 20, processors external to IC 10, dedicated actuator 18, or a combination of these or other processing and control elements.

Distribution of the cooling actions is a design option of IC 10 and the system IC 10 is designed to operate in. For example, a simple over-temperature condition may signal primary functionality 20 and/or an external component to take a cooling action. A more complex heat management system may involve a plurality of temperature thresholds with a corresponding plurality of cooling actions available. Each cooling action may be triggered by a value from A/D converter 16 and output to dedicated pad on IC 10, to an internal component of the primary processor 20, to an external component via a data bus connected to IC 10 or a combination of all available actions. The cooling options available and the heat management program to be implemented will guide the IC designers selection of how to distribute the cooling action initiation control resulting from the self-monitoring circuitry output.

FIG. 3 shows an exemplary process 30 for self-monitoring within an IC. A temperature is sensed by first a sensor, such as applying 32 a voltage to a thermal diode. Signal modification logic 33 provides for modification of the resulting temperature dependent signal and may be implemented as a matter of design choice. Such modification may include gain changes in the analog signal or signal filtering to remove undesired components of the signal. Still further, signal modification logic 33 may include features operable on the A/D converter to modify the range and resolution of the conversion process of the A/D converter. In other words, signal modification logic may include features to modify the analog signal applied to the A/D converter, features to modify the operation of the A/D converter, or both. If such signal modification logic 33 is implemented, test 34 determines if the thermal diode analog signal or the A/D converter parameters require modification and, if so, modifies 36 appropriate signals.

In particular, signal modification logic may include methods to controllably offset a reference voltage applied to an A/D converter. Such an offset may be selectively applied to either or both of a high-level reference voltage applied to the A/D converter and a low-level reference voltage applied to the A/D converter. The offset may be selectively controlled by control of a variable resistive element. For example, a desired number of resistors in series may be switched into a circuit coupling a reference voltage to the A/D converter (through the variable resistors). Or, for example, the reference voltage may be directly controlled by selecting one of a number of available reference voltages or by adjusting the level of the reference voltage via a programmable voltage source.

Further, the method may include adjusting either a high-level reference voltage, a low-level reference voltage, or both. The high value of a reference potential may be offset to lower the high-level applied to the A/D converter. Similarly, the low-level (i.e., ground level) may be offset to a higher potential to raise the low-level reference voltage applied to the A/D converter. Those of ordinary skill in the art will readily recognize these and other similar method steps within the scope of the present invention. Exemplary structures in which such adjustments may be performed are discussed further herein below.

The analog signal is then converted 38 to a thermal digital signal. Error correction process 39 provides for error correction of the digital signal as a matter of design choice. If error correction process 39 is implemented, test 40 determines if error correction is required and, if so, corrects 42 the thermal digital signal in an error state. Error correction may take the form of erroneous signal (i.e., noise) cancellation, low-pass filtering to eliminate transient signals, or other correction.

In one aspect of the method, the correction may be applied to the output of a flash A/D converter by gating each of a plurality of threshold comparator output signals with the next lower value. In other words, invalid signals indicating the analog signal exceeds a higher threshold value while falling below a lower threshold value of the flash A/D converter may be corrected. Such conditions may be generated by, for example, transient signals generated by the reference voltage source or other noise signals generated or induced in the circuits.

Self-monitoring may be extended to implement cooling logic 43 as a matter of design choice. If cooling logic 43 is not implemented, the digital output from step 38 may be used to signal another apparatus of a threshold temperature comparison result. If cooling logic 43 is implemented, test 44 determines if there is an over-temperature condition. Test 48 determines if a cooling action is already active. If so, the cooling action is continued. If a cooling action is not active, then a cooling action is activated 52. As a matter of design choice, test 44 may make a single comparison, wherein a single cooling action may be initiate 52 (e.g., turn on the fan when an over-temperature condition is detected) or test 44 may test the digital signal against a multitude of thresholds, wherein a plurality of cooling actions may be initiated 52 (e.g., activate a fan, slow the clock speed, operator notification, system shut-down). If test 44 determines there is no over-temperature condition, then test 46 determines if a cooling action is active 46, and if so discontinues 50 a cooling action. As an implementation option, a second "shut-off" temperature may be implemented for each corresponding cooling action "turn-on" temperature. Discontinuing 50 of a cooling action may be conditional on an additional test determining if the cooling action initiated 52 is below the "shut-off" temperature and therefore redundant before discontinuing 50 a cooling action. If test 46 determines there is no cooling action active, processing continues. Delay 54, which may be of zero or more clock cycles or event triggered, idles process 30 when additional readings are not required. After delay 54 processing continues with application 32 of a voltage to the thermal diode.

Those of ordinary skill in the art will appreciate that the methods described herein may be obtainable in a suitably programmed general purpose or special purpose processor or may be implemented as a custom circuit. The benefit of such flexibility allows the implementation as a matter of hardware design, software implementation, or a combination thereof.

FIG. 4 shows a block diagram for an exemplary self-monitoring system 70 with optional signal modification 74. Reference voltage 72 is a potential provided from a power source. Reference voltage 72 represents a potential difference from ground 96 created by, for example, an external power supply (not shown). Current source 84 is a source of constant current at node 102. Thermal diode 94 varies its electrical characteristics in proportion to the temperature in which it operates. In particular, thermal diode 94 may vary its resistance to current flow in proportion to the temperature in which it operates. Thermal diode 94 therefore serves to vary the voltage present at node 102 and applied as an input to A/D converter 86 via path 90. Current source 84 may be any current source coupled to a voltage source 72 that can provide a constant current applied to thermal diode 94. As a result of temperature dependant variations in resistance in thermal diode 94, circuit segment 102 provides a temperature dependent potential at node 102. This thermal potential difference is applied via path 90 to A/D converter 86 that, in turn, converts the analog value to a thermal digital value signal applied to path 100. Actuator 98 may be included to read and compare the digital signal on path 100 to a predetermined or configurable threshold value. If actuator 98 detects an over-temperature condition, it may then initiate a cooling action. Actuator 98 may be a dedicated heat management actuator device or circuit or may be a programmable device receiving an over-temperature interrupt or reading a latched value from A/D converter 86. Actuator 98 may then trigger an appropriate remedial action to reduce heat generation by the IC or to activate cooling devices to dissipate the excess heat.

A/D converter 86 may be any standard analog to digital converter as well known to those skilled in the art. In one aspect discussed in further detail below, A/D converter 86 may be a flash A/D converter that receives a reference voltage and compares the input signal (on path 90) to each of a plurality of divisions of the reference voltage. More specifically, flash A/D converter 86 ("ADC") may receive a high-level reference voltage (Vref 72) and a low-level reference voltage (ground 96). The flash ADC may then create a number of intermediate voltages and may compare the input signal 90 to each of the intermediate voltages. The output of flash ADC is then the result of the comparisons indicating which intermediate voltage is closest to the input signal.

Modification circuitry 74 provides adjustments to A/D converter 86 such as adjustments to the range and/or resolution of the A/D converter operation. Modification circuitry 74 is an optional feature of the invention that may be implemented or disregarded as a matter of design choice. Further, if implemented, operation of the modification circuitry 74 may be selectively enabled or disabled as desired by the designer. In general, modification circuitry 74 may adjust the range of operation of A/D converter 86 to allow for a broader or narrower range of input signal amplitudes to be converted. Similarly, modification circuitry 74 may adjust the resolution in operation of appropriate types of A/D converters. For example, as discussed further herein below, a flash A/D converter may be adjusted for both range and resolution in its operation by offsetting a high and low-level reference voltage applied to the A/D converter. Those skilled in the art will recognize numerous other approaches to adjust the operation of an A/D converter to account for variations in the temperature sensing capabilities of the thermal diode and fabrication process variations. Further, such modifications to the operating parameters of the A/D converter may be performed statically as an aspect of the manufacturing process or may be performed dynamically during operation of the IC embodying the thermal self-monitoring features of the present invention.

FIG. 5 shows a detailed schematic for an exemplary self-monitoring circuit 120 with optional offset shifting 122 and optional qualified encoding 178. Current source 126 drives a constant current from voltage source Vref 124 to thermal diode 170 coupled to ground 168. Thermal diode 170 provides a temperature dependant potential at an input to flash A/D converter 176. As is known in the art, flash A/D converter 176 comprises a plurality of comparators 190 each having a first input coupled to the thermal potential difference generated by the voltage drop from effects of the thermal diode 170. Each comparator of the flash A/D converter 176 receives on its second input a threshold voltage generated by the voltage drops across each of the fixed resistors 146 between Vref 124 and ground 168. Flash A/D converter 176 (ADC) therefore generates eight output signals I1 . . . I8 as the output of the eight comparators 190. Each output signal therefore indicates, if asserted logic high, that the thermal potential difference applied to the corresponding comparator is higher than the threshold voltage applied to the other input of the corresponding comparator.

The combination of these eight output signals (I1 . . . I8) is therefore a digitized representation of the analog thermal potential difference applied to the ADC 176 and generated by the thermal diode 170 in proportion to its operating temperature. The ADC output signals represent a sequence of threshold comparisons of the thermal potential difference to a set of corresponding threshold reference voltages. The digitized value (thermal digital value) therefore indicates that the thermal potential difference applied to the ADC (proportionate to the operating temperature of the IC) is between the voltage corresponding to the highest threshold comparator output that is asserted high and the next higher threshold voltage where the comparator output is deasserted (a logic low).

As is known in the art, the ADC 176 compares the applied analog input signal to a plurality of threshold voltage approximately evenly divided between a high reference potential (such as Vref 124) and a low reference potential (such as ground 168). Though eight such divisions are shown in ADC 176 of FIG. 5, any number of such divisions may be used as a matter of design choice if finer resolution is desired in converting the analog thermal potential difference to a thermal digital value. In addition, those skilled in the art will recognize a variety of similar analog to digital converters may be employed that do not use the simple flash structure. Numerous ADC structure are well known to those of ordinary skill in the art and may be employed in the present invention to convert an analog thermal value to a corresponding thermal digital value. Further, several such ADC structures may incorporate features to adjust the resolution of the conversion processes.

In addition, optional modification circuits 122 may be employed to permit further adjustments to the range and corresponding resolution of the flash ADC 176. As noted above, flash ADC 176 receives a high-level reference voltage and a low-level reference voltage and generates intermediate threshold divisions between those two reference voltages. Modification circuits 122 may be added to the self-monitoring circuits 120 to permit further adjustments in the range and hence resolution of the flash ADC 176. In particular, modification circuits include a high-level reference voltage offset to reduce the voltage applied to flash ADC 176 as the high-level reference voltage. In general, any means for adjusting the high-level reference voltage applied to flash ADC 176 may be employed within the spirit and scope of the present invention. A programmable voltage source may be utilized, for example, coupled to an appropriate control device to alter the output of the programmable voltage source. Lowering the high-level reference voltage narrows the range of voltage that are converted by flash ADC 176 and hence reduces the potential difference between respective threshold voltages applied to the plurality of comparators 190 in the flash ADC 176 thus increasing the resolution of the flash ADC 176 in converting the analog thermal potential difference to a thermal digital value.

In like manner, an aspect of the invention may include a similar variable voltage source for application of a low-level reference voltage to the flash ADC 176. As above, the flash ADC compares the applied input signal to a plurality of intermediate threshold voltages between the high-level reference voltage and the low-level reference voltage. By raising the low-level reference voltage up from ground potential closer to the high-level reference voltage, the range of values converted by the flash ADC 176 is reduced and hence the resolution within the reduced range is increased.

By adjusting the high-level reference voltage, the low-level reference voltage, or both, the modification circuitry 122 may reduce the range of voltages converted by the flash ADC 176 and hence improve the resolution of the conversions within that reduced range. Such variations in the range and resolution of the ADC may be employed to improve the resolution of measurements within a narrower operating temperature range of interest for purposes of temperature management of the IC. Where a narrow range of temperatures define the normal operating conditions through which cooling components need be operated, the improved resolution of the ADC using the modification circuitry 122 allows for better management of the temperature as it crosses over the various thresholds. In addition, those skilled in the art will recognize that the variations between the sequential threshold points need not be equal. Rather, the potential difference between each sequential threshold voltage used within the flash ADC 176 may be similarly controlled or varied.

In one exemplary embodiment of the invention shown in FIG. 5, modification circuitry 122 includes a sequence of resistors 140, 142 and 144 that may be switchably added to the conductive path coupling Vref 124 to the flash ADC 176 as a high-level reference voltage. By switchably selecting zero or more of the sequence of resistors 140, 142 and 144, the high-level reference voltage may be controllably lowered. Transistors 132, 136 and 138 may provide the desired controlled switching to enable configuring zero or more the sequence of resistors 140, 142 and 144 in the conductive path applying a high-level reference voltage to flash ADC 176. Decoder 130 may be used to decode a 2-bit wide digital value applied to path 160 (e.g., D2 and D3) and activate transistors 132, 136 and 138 via signals applied to the transistor gates on paths Qd . . . Qf. The activated transistors therefore configure the desired sequence of additional resistors 140, 142 and 144. Similarly, decoder 130 may receive a 2-bit wide signal on path 160 (D0 and D1) and decode it into signals applied via paths Qa . . . Qc to the gates of transistors 154, 156 and 158. The selected transistors then configure the desired zero or more additional resistors 148, 150 and 152 to raise the voltage above ground potential for the lower level reference voltage applied to flash ADC 176.

Those of ordinary skill in the art will recognize that any number of configurable resistors may be employed to provide additional flexibility in adjusting the high-level reference voltage and/or the low-level reference voltage applied to flash ADC 176. Further, those skilled in the art will recognize a variety of similar structures and methods for controllably configuring the additional resistors to adjust the reference voltages.

Also shown in FIG. 5 is the use of a qualified encoder 178 to encode the threshold indicator output signals I1 . . . I8 generated by flash ADC 176 into an encoded thermal digital value applied to path 174 (Q0 . . . Q3). As noted above, the encoded digital value may be applied to output pads of the IC for further processing to control cooling features of the system using the improved IC with temperature self-monitoring. Further, the encoded output signals (Q0 . . . Q3) or unencoded output signals (I1 . . . I8) may be applied to processing elements within the IC to determine and actuate appropriate cooling actions.

Encoder 178 may also provide adjustment features to adjust the unencoded output signal (I1 . . . I8) applied as input thereto to correct for errors or other transient signals. As discussed above, flash ADC 176 of FIG. 5 generates unencoded output signals I1 . . . I8 indicating a thermal digital value proportional to the temperature of the IC. Each output signal indicates the output of a corresponding comparator comparing the present thermal potential difference to a corresponding threshold voltage. Transient signals may cause momentary anomalies in the generated output. Qualified encoder 178 therefore may include features to reduce or eliminate such anomalies in the thermal digital value received on I1 . . . I8 and encoded and applied to Q0 . . . Q3.

FIG. 6 shows an exemplary error correcting circuit 200 element within such a qualified encoder 176 of FIG. 5. In one aspect of the invention, an A/D converter provides a series of bit lines each indicating that the analog signal applied to the converter is, or is not, above a corresponding threshold voltage. The bit lines are arranged in a hierarchical order wherein no bit should in the logical "on" state without each lower bit (corresponding to a lower threshold voltage) also being in the logical "on" state. Error correcting circuit 200 of FIG. 6 provides an exemplary structure for enforcing such a requirement. A plurality of bit inputs 202A . . . 202H (I1 . . . I8) provide input signals to encoder 206. Bit input 202A, having no lower peer, provides a direct signal to encoder 206. Each bit input 202B . . . H, having a lower peer, is gated for application to encoder 206 by a corresponding AND gate 204A . . . G coupled to the next lower bit input 202A . . . G, respectively. This structure effectively nullifies any "on" bit not accompanied by the next lower peer, also in an "on" state. The structure and operation of error correction circuit 200 may also be understood with reference to the following truth table:

| I8 | I7 | I6 | I5 | I4 | I3 | I2 | I1 | Q3 | Q2 | Q1 | Q0 |
|----|----|----|----|----|----|----|----|----|----|----|----|
| X  | X  | X  | X  | X  | X  | X  | 0  | 0  | 0  | 0  | 0  |
| X  | X  | X  | X  | X  | X  | 0  | 1  | 0  | 0  | 0  | 1  |
| X  | X  | X  | X  | X  | 0  | 1  | 1  | 0  | 0  | 1  | 0  |
| X  | X  | X  | X  | 0  | 1  | 1  | 1  | 0  | 0  | 1  | 1  |
| X  | X  | X  | 0  | 1  | 1  | 1  | 1  | 0  | 1  | 0  | 0  |
| X  | X  | 0  | 1  | 1  | 1  | 1  | 1  | 0  | 1  | 0  | 1  |
| X  | 0  | 1  | 1  | 1  | 1  | 1  | 1  | 0  | 1  | 1  | 0  |
| 0  | 1  | 1  | 1  | 1  | 1  | 1  | 1  | 0  | 1  | 1  | 1  |
| 1  | 1  | 1  | 1  | 1  | 1  | 1  | 1  | 1  | 1  | 1  | 1  | where "X" means a "don't care" state.

Those of ordinary skill in the art will readily recognize that although FIG. 5 and FIG. 6 both indicate eight output signals from the ADC (I1 . . . I8) and indicate encoding of the eight signals into four qualified output signals (Q0 . . . Q3), any number of signals may be used in accordance with the needs of the particular application.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A method for temperature self-monitoring in an integrated circuit comprising:
   coupling a thermal diode within said integrated circuit to a voltage source to generate a thermal potential difference;
   converting said thermal potential difference to a thermal digital value within said integrated circuit wherein the step of converting further comprises applying the thermal potential difference to an input signal path of a flash analog to digital converter to generate the thermal digital value as an output of the flash analog to digital converter wherein the flash analog to digital converter has a reference input signal path coupled to a reference voltage source; and
   applying said thermal digital value to an output signal pad of said integrated circuit.

2. The method of claim 1 wherein the step of coupling said reference input signal path comprises:
   coupling said reference input signal path to said reference voltage source through a variable resistive element.

3. The method of claim 2 further comprising:
   coupling a programmable switch to said variable resistive element to selectively control resistance of said variable resistive element; and
   programming said programmable switch to vary the voltage applied to said reference input signal path.

4. The method of claim 1 further comprising:
   adjusting operation of said flash analog to digital converter to reduce errors in generation of said thermal digital value.

5. The method of claim 4 where in the step of adjusting comprises:
   gating input signals applied to each of a series of comparators within said flash analog to digital converter to enable each higher threshold comparator in response to a comparison of a next lower threshold comparator.

6. An integrated circuit including:
   a constant current source coupled to a reference voltage source;
   a thermal diode coupled between said constant current source and ground potential to produce a thermal potential difference; and
   a flash analog to digital converter having an input signal path coupled to a node at said thermal potential difference and having a reference voltage input signal path coupled to a reference voltage source to generate a thermal digital signal applied to an output pad of said integrated circuit.

7. The integrated circuit of claim 6 further comprising:
   a range adjuster coupled to said reference voltage input signal path to adjust the voltage range of conversion for the thermal potential difference applied to said analog to digital converter.

8. The integrated circuit of claim 7 wherein said range adjuster comprises:
   an offset voltage source to offset the reference voltage applied to said reference voltage input signal path.

9. The integrated circuit of claim 6
   wherein said flash analog to digital converter generates an unqualified thermal digital signal, the unqualified thermal digital signal comprising a plurality of level indicator output signals, and
   wherein the integrated circuit further comprises:
   a qualified encoder coupled to the flash analog to digital converter to encode the unqualified thermal digital signal to generate the thermal digital signal such that transient effects are reduced.

10. The integrated circuit of claim 9 wherein the plurality of level indicator output signals indicate a sequence of threshold levels of the thermal potential difference and wherein the qualified encoder includes:
    a plurality of AND gates coupled to the flash analog to digital converter such that the level indicator output signal representing the lowest threshold level is coupled to the qualified encoder as the lowest level input signal of the qualified encoder and such that each higher threshold level input signal is coupled to an input of a corresponding AND gate of the plurality of AND gates and such that the output of the corresponding AND gate is coupled to the qualified encoder as an input and such that another input of the corresponding AND gate is coupled to the input signal of the qualified encoder corresponding to the next lower threshold level.

11. The integrated circuit of claim 9 wherein the plurality of level indicator output signals indicate a sequence of eight threshold levels (I1 ... I8) of the thermal potential difference and wherein the qualified encoder includes:
four qualified output signals (Q0 ... Q3); and
logic circuits coupled to receive I1 ... I8 as inputs and adapted to generate output signals Q0 ... Q3 such that:

| I8 | I7 | I6 | I5 | I4 | I3 | I2 | I1 | Q3 | Q2 | Q1 | Q0 |
|---|---|---|---|---|---|---|---|---|---|---|---|
| X | X | X | X | X | X | X | 0 | 0 | 0 | 0 | 0 |
| X | X | X | X | X | X | 0 | 1 | 0 | 0 | 0 | 1 |
| X | X | X | X | X | 0 | 1 | 1 | 0 | 0 | 1 | 0 |
| X | X | X | X | 0 | 1 | 1 | 1 | 0 | 0 | 1 | 1 |
| X | X | X | 0 | 1 | 1 | 1 | 1 | 0 | 1 | 0 | 0 |
| X | X | 0 | 1 | 1 | 1 | 1 | 1 | 0 | 1 | 0 | 1 |
| X | 0 | 1 | 1 | 1 | 1 | 1 | 1 | 0 | 1 | 1 | 0 |
| 0 | 1 | 1 | 1 | 1 | 1 | 1 | 1 | 0 | 1 | 1 | 1 |
| 1 | 1 | 1 | 1 | 1 | 1 | 1 | 1 | 1 | 1 | 1 | 1 | where "X" means don't care.

12. A method operable within an integrated circuit, the method comprising:
generating a signal from a thermal diode within the integrated circuit indicative of the present temperature within the integrated circuit;
applying the signal to a flash analog to digital converter within the intergrated circuit to generate a thermal digital value indicative of the present temperature within the integrated circuit; and
applying the thermal digital value to output signals of the integrated circuit.

13. The method of claim 12 further comprising:
adjusting the thermal digital value prior to applying the thermal digital value to reduce transient effects in the monitoring.

14. An integrated circuit including:
thermal diode means for generating a signal indicative of the present temperature within the intergrated circuit;
flash analog to digital converter means, coupled to receive the thermal diode signal, for converting the thermal diode signal to generate a thermal digital value indicative of the present temperature within the integrated circuit; and
means for applying the thermal digital value to output signals of the integrated circuit.

15. The integrated circuit of claim 14 further including:
means for adjusting the thermal digital value prior to applying the thermal digital value to reduce transient effects in the monitoring.

16. A system for temperature self-monitoring in an integrated circuit comprising:
thermal diode means coupled within said integrated circuit to a voltage source for generating a thermal potential difference;
means for converting said thermal potential difference to a thermal digital value within said integrated circuit wherein the means for converting further comprises flash analog to digital converter means coupled to a reference voltage source and coupled to the thermal diode to convert the thermal potential difference into the thermal digital value; and
means for applying said thermal digital value to an output signal pad of said integrated circuit.

17. The system of claim 16 wherein the reference voltage source is coupled to the flash analog to digital converter means through a variable resistive means.

18. The system of claim 17 further comprising:
programmable switch means coupled to said variable resistive means to selectively control resistance of said variable resistive means; and
means for programming said programmable switch means to vary the voltage applied to said flash analog to digital converter means.

19. The system of claim 16 further comprising:
means for adjusting operation of said flash analog to digital converter means to reduce errors in generation of said thermal digital value.

20. The system of claim 19 where in the means for adjusting comprises:
means for gating input signals applied to each of a series of comparators within said flash analog to digital converter means to enable each higher threshold comparator in response to a comparison of a next lower threshold comparator.

* * * * *